United States Patent
Takeda et al.

(10) Patent No.: US 12,463,017 B2
(45) Date of Patent: Nov. 4, 2025

(54) SUBSTRATE PROCESSING APPARATUS, PLASMA LIGHT EMITTING APPARATUS AND METHOD OF MANUFACTURING SEMICONDUCTOR DEVICE

(71) Applicant: KOKUSAI ELECTRIC CORPORATION, Tokyo (JP)

(72) Inventors: Tsuyoshi Takeda, Toyama (JP); Daisuke Hara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 127 days.

(21) Appl. No.: 18/105,395

(22) Filed: Feb. 3, 2023

(65) Prior Publication Data

US 2023/0187179 A1 Jun. 15, 2023

Related U.S. Application Data

(63) Continuation of application No. PCT/JP2020/035535, filed on Sep. 18, 2020.

(51) Int. Cl.
*H01J 37/32* (2006.01)

(52) U.S. Cl.
CPC .. *H01J 37/32449* (2013.01); *H01J 37/32146* (2013.01); *H01J 37/32568* (2013.01); *H01J 37/32834* (2013.01)

(58) Field of Classification Search
None
See application file for complete search history.

(56) References Cited

U.S. PATENT DOCUMENTS

| | | | | |
|---|---|---|---|---|
| 4,811,684 A | * | 3/1989 | Tashiro | C23C 16/482 136/258 |
| 5,565,036 A | * | 10/1996 | Westendorp | C23C 16/5096 156/345.47 |
| 2004/0025786 A1 | * | 2/2004 | Kontani | C23C 16/45578 118/715 |
| 2007/0259111 A1 | * | 11/2007 | Singh | C23C 16/45508 427/248.1 |
| 2008/0124945 A1 | * | 5/2008 | Miya | H01L 21/0214 438/778 |
| 2010/0087069 A1 | * | 4/2010 | Miya | H01L 21/3141 118/725 |
| 2019/0157049 A1 | | 5/2019 | Sato et al. | |

FOREIGN PATENT DOCUMENTS

| | | |
|---|---|---|
| JP | 06-342786 A | 12/1994 |
| JP | 2000-124199 A | 4/2000 |
| JP | 2005-123434 A | 5/2005 |
| JP | 2009-194018 A | 8/2009 |
| JP | 2017-054654 A | 3/2017 |
| WO | 2018/016131 A1 | 1/2018 |

* cited by examiner

*Primary Examiner* — Karla A Moore
(74) *Attorney, Agent, or Firm* — Volpe Koenig

(57) ABSTRACT

According to one aspect of the technique of the present disclosure, there is provided a substrate processing apparatus including: a process chamber in which a substrates is processed; and a plasma generator including: a first gas supply pipe through which a first gas is supplied; an application electrode to which a high frequency power is applied; a reference electrode to which a reference potential is applied by being grounded; and a light emitting tube by which the first gas is photo-exited.

14 Claims, 4 Drawing Sheets

SUBSTRATE PROCESSING APPARATUS, PLASMA LIGHT EMITTING APPARATUS AND METHOD OF MANUFACTURING SEMICONDUCTOR DEVICE

CROSS-REFERENCE TO RELATED PATENT APPLICATION

This application is a bypass continuation application of PCT International Application No. PCT/JP2020/035535, filed on Sep. 18, 2020, in the WIPO, the entire contents of which are hereby incorporated by reference.

BACKGROUND

1. Field

The present disclosure relates to a substrate processing apparatus, a plasma light emitting apparatus and a method of manufacturing a semiconductor device.

2. Related Art

According to some related arts, as a part of a manufacturing process of a semiconductor device, a substrate processing may be performed on a substrate by transferring (or loading) the substrate into a process chamber of a substrate processing apparatus and by supplying (or introducing) a source gas and a reactive gas into the process chamber. For example, a process of forming a film such as an insulation film, a semiconductor film and a conductor film on the substrate or a process of removing various films formed on the substrate may be performed as the substrate processing.

In a mass-produced device in which fine patterns are formed, in order to suppress a diffusion of impurities or make it possible to use a low heat resistant material such as an organic material, it is preferable that a process temperature is lowered.

In order to address such a problem described above, in general, the substrate processing may be performed by using a plasma. However, in such a case, a sufficient amount of the plasma or a sufficient amount of an active species generated through the plasma should be supplied to a central portion of the substrate. When the plasma is confined in a space referred to as a "buffer chamber" and the active species are supplied to the substrate through a hole (in particular, when the plasma is supplied to a low temperature substrate with a large surface area), the active species may be insufficiently supplied to the substrate due to a high consumption of the active species. Thereby, a process performance in the central portion of the substrate may be lowered.

SUMMARY

According to the present disclosure, there is provided a technique capable of providing a high substrate processing performance even when a low temperature substrate with a large surface area is used.

According to one aspect of the technique of the present disclosure, there is provided a substrate processing apparatus including: a process chamber in which a substrate is processed; and a plasma generator including: a first gas supply pipe through which a first gas is supplied; an application electrode to which a high frequency power is applied; a reference electrode to which a reference potential is applied by being grounded; and a light emitting tube by which the first gas is photo-exited.

DETAILED DESCRIPTION

Embodiments of Present Disclosure

Figure 1:
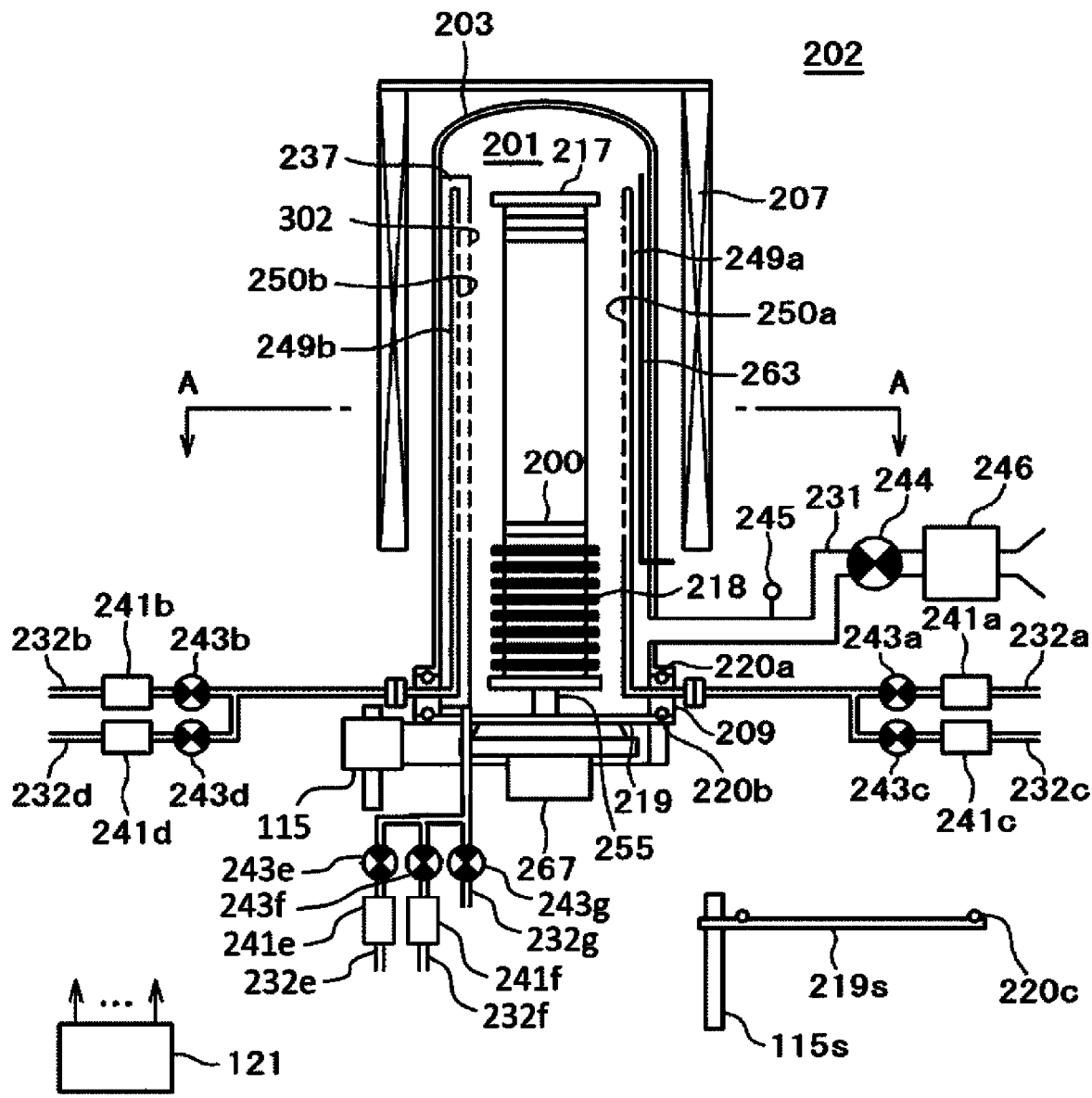
FIG. 1 is a diagram schematically illustrating a vertical cross-section of a vertical type process furnace of a substrate processing apparatus preferably used in one or more embodiments of the present disclosure.

Hereinafter, one or more embodiments (also simply referred to as "embodiments") according to the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

<Heater>

As shown in FIG. 1, a substrate processing apparatus according to the present embodiments includes a process furnace 202. The process furnace 202 is provided with a heater 207 serving as a heating apparatus (or a heating structure). The heater 207 is of a cylindrical shape, and is vertically installed while being supported by a support plate (not shown). The heater 207 also functions as an activator (which is an activation structure) or an exciter (which is an excitation structure) capable of activating (or exciting) a gas such as a source gas by a heat as will be described later.

<Process Chamber>

A reaction tube 203 is provided at an inner side of the heater 207 to be aligned in a manner concentric with the heater 207. For example, the reaction tube 203 is made of a heat resistant material such as quartz ($SiO_2$) and silicon carbide (SiC). The reaction tube 203 is of a cylinder shape with a closed upper end and an open lower end. A manifold 209 is provided under the reaction tube 203 to be aligned in a manner concentric with the reaction tube 203. For example, the manifold 209 is made of a metal such as stainless steel (SUS). The manifold 209 is of a cylinder shape with open upper and lower ends. The upper end of the manifold 209 is engaged with the lower end of the reaction tube 203 so as to support the reaction tube 203. An O-ring 220a serving as a seal is provided between the manifold 209 and the reaction tube 203. As the manifold 209 is supported by a heater base (not shown), the reaction tube 203 is installed vertically. A process vessel (also referred to as a "reaction vessel") is constituted mainly by the reaction tube 203 and the manifold 209. A process chamber 201 is provided in a hollow cylindrical portion of the process vessel. The process chamber 201 is configured to accommodate a plurality of wafers including a wafer 200 serving as a substrate. Hereinafter, the plurality of wafers including the wafer 200 may also be simply referred to as "wafers 200". The process vessel is not limited to the configuration described above. For example, the reaction tube 203 alone may be referred to as the "process vessel".

<Gas Supplier>

Nozzles 249a and 249b are provided in the process chamber 201 so as to penetrate a side wall of the manifold 209. Further, a light emitting tube 249e is provided in the process chamber 201 so as to penetrate the side wall of the manifold 209. A gas supply pipe 232a is connected to the nozzle 249a, a gas supply pipe 232b is connected to the nozzle 249b and a gas supply pipe 232e is connected to the light emitting tube 249e. As described above, two nozzles (that is, the nozzles 249a and 249b), one light emitting tube (that is, the light emitting tube 249e) and three gas supply pipes (that is, the gas supply pipe 232a, the gas supply pipe 232b and the gas supply pipe 232e) are provided in the process vessel such that various gases are capable of being supplied into the process chamber 201. Further, when the reaction tube 203 alone is referred to as the process vessel, the nozzle 249a, the nozzle 249b and the light emitting tube 249e may be provided so as to penetrate a side wall of the reaction tube 203.

A mass flow controller (MFC) 241a and a valve 243a are provided at the gas supply pipe 232a in this order from an upstream side to a downstream side of the gas supply pipe 232a in a gas flow direction. A mass flow controller (MFC) 241b and a valve 243b are provided at the gas supply pipe 232b in this order from an upstream side to a downstream side of the gas supply pipe 232b in the gas flow direction. A mass flow controller (MFC) 241e and a valve 243e are provided at the gas supply pipe 232e in this order from an upstream side to a downstream side of the gas supply pipe 232e in the gas flow direction. Each of the MFCs 241a, 241b and 241e serves as a flow rate controller (which is a flow rate control structure), and each of the valves 243a, 243b and 243e serves as an opening/closing valve. Gas supply pipes 232c, 232d and 232f through which an inert gas is supplied are connected to the gas supply pipes 232a, 232b and 232e at downstream sides of the valve 243a of the gas supply pipe 232a, the valve 243b of the gas supply pipe 232b and the valve 243e of the gas supply pipe 232e, respectively. An MFC 241c and a valve 243c are provided at the gas supply pipe 232c in this order from an upstream side to a downstream side of the gas supply pipe 232c in the gas flow direction, an MFC 241d and a valve 243d are provided at the gas supply pipe 232d in this order from an upstream side to a downstream side of the gas supply pipe 232d in the gas flow direction and an MFC 241f and a valve 243f are provided at the gas supply pipe 232f in this order from an upstream side to a downstream side of the gas supply pipe 232f in the gas flow direction. Further, a gas exhaust pipe 232g through which a gas inside the light emitting tube 249e is exhausted is connected to the gas supply pipe 232e at a downstream side of the valve 243e of the gas supply pipe 232e via an exhaust valve 243g.

Figure 2:
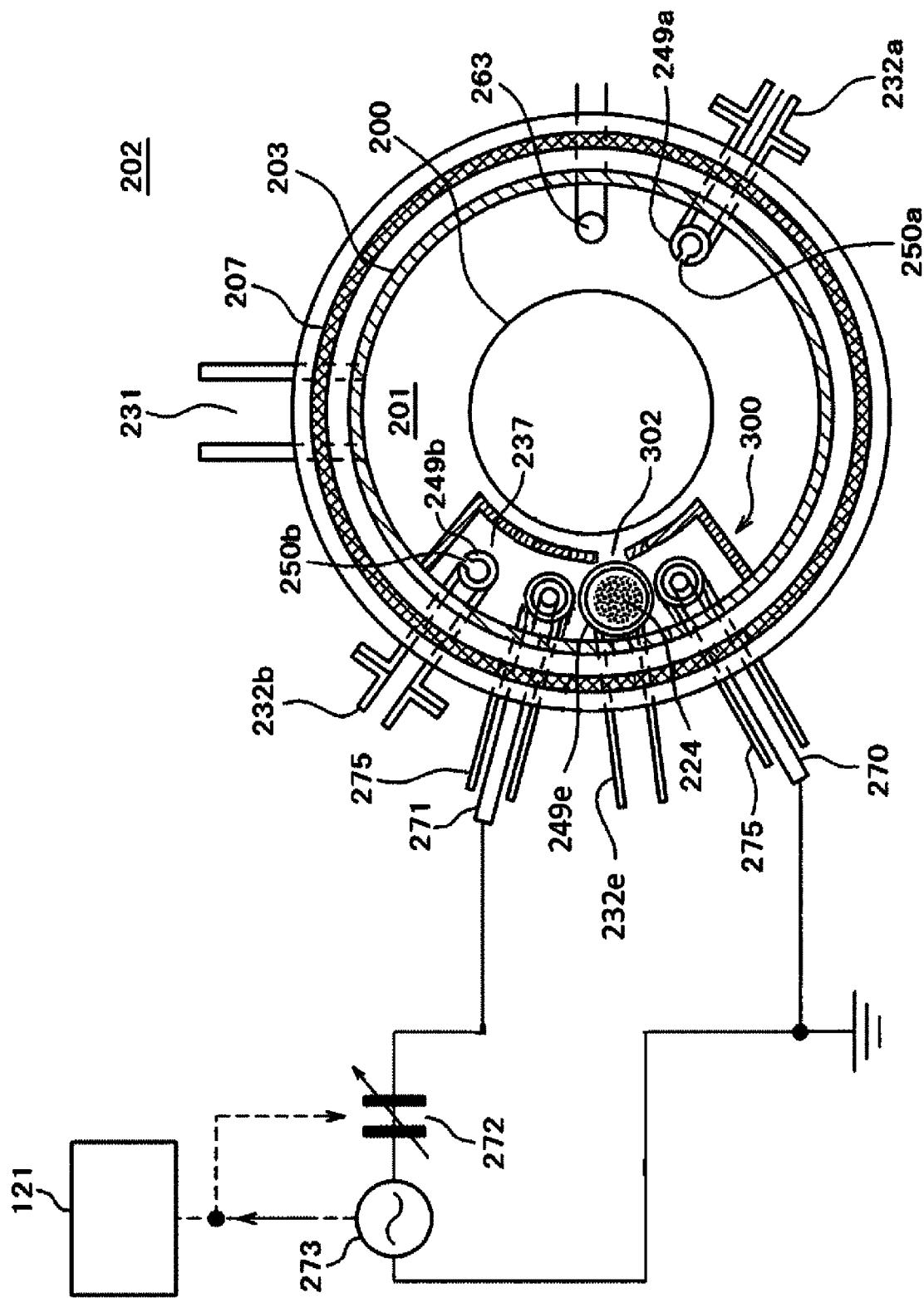
FIG. 2 is a diagram schematically illustrating a horizontal cross-section taken along a line A-A, shown in FIG. 1, of the vertical type process furnace of the substrate processing apparatus preferably used in the embodiments of the present disclosure.

As shown in FIG. 2, the nozzle 249a is installed in an annular space provided between an inner wall of the reaction tube 203 and the wafers 200 when viewed from above, and extends upward from a lower portion of the reaction tube 203 toward an upper portion of the reaction tube 203 along the inner wall of the reaction tube 203 (that is, extends upward along a stacking direction of the wafers 200). That is, the nozzle 249a is installed in a region that is located beside and horizontally surrounds a wafer arrangement region (also referred to as a "wafer placement region") in which the wafers 200 are arranged (or placed) to extend along the wafer arrangement region. That is, the nozzle 249a is provided adjacent to an edge (which is a peripheral portion) of each of the wafers 200 transferred (or loaded) into the process chamber 201. In other words, the nozzle 249a is provided perpendicularly to a surface (which is a flat surface) of each of the wafers 200. A plurality of gas supply holes 250a through which the source gas is supplied are provided at a side surface of the nozzle 249a. The gas supply holes 250a are open toward a center of the reaction tube 203 such that the gas (that is, the source gas) is capable of being supplied toward each of the wafers 200 accommodated in the process chamber 201 through the gas supply holes 250a. The gas supply holes 250a are provided from the lower portion to the upper portion of the reaction tube 203. Opening areas of the gas supply holes 250a are equal to one another, and the gas supply holes 250a are provided at the same pitch.

As shown in FIG. 2, a plasma generator (which is a plasma generating structure) 237 serving as a buffer chamber is installed in the annular space between the inner wall of the reaction tube 203 and the wafers 200 accommodated in the process chamber 201 when viewed from above, and extends upward from the lower portion toward the upper portion of the reaction tube 203 along the inner wall of the reaction tube 203 (that is, extends upward along the stacking direction of the wafers 200). That is, the plasma generator 237 serving as the buffer chamber is defined by a buffer structure 300 installed in the region that is located beside and horizontally surrounds the wafer arrangement region to extend along the wafer arrangement region. For example, the buffer structure 300 is made of an insulating material such as quartz. A plurality of gas supply ports 302 through which a gas such as a first gas is supplied are provided on an arc-shaped wall surface of the buffer structure 300. As shown in FIG. 2, the gas supply ports 302 are provided to face the light emitting tube 249e arranged between a reference electrode 270 and an application electrode 271 described later. The gas supply ports 302 are open toward the center of the reaction tube 203 such that the gas such as the first gas is capable of being supplied toward each of the wafers 200 accommodated in the process chamber 201 through the gas supply ports 302. The gas supply ports 302 are provided from the lower portion to the upper portion of the reaction tube 203. Opening areas of the gas supply ports 302 are equal to one another, and the gas supply ports 302 are provided at the same pitch.

The nozzle 249b and the light emitting tube 249e are provided so as to extend upward from the lower portion toward the upper portion of the reaction tube 203 along the inner wall of the reaction tube 203 (that is, to extend upward along the stacking direction of the wafers 200). That is, the nozzle 249b and the light emitting tube 249e are installed inside the buffer structure 300 in the region that is located beside and horizontally surrounds the wafer arrangement region in which the wafers 200 are arranged to extend along the wafer arrangement region. That is, the nozzle 249b and the light emitting tube 249e are provided adjacent to the edge of each of the wafers 200 transferred (or loaded) into the process chamber 201. In other words, the nozzle 249b and the light emitting tube 249e are provided perpendicularly to the surface of each of the wafers 200. A plurality of gas supply holes 250b through which the first gas is supplied are provided at a side surface of the nozzle 249b. The gas supply holes 250b are open toward a wall surface of the buffer structure 300 provided along a radial direction with respect to the arc-shaped wall surface of the buffer structure 300 such that the gas (that is, the first gas) is capable of being supplied toward the wall surface of the buffer structure 300 through the gas supply holes 250b. As a result, the first gas is dispersed (or diffused) in the plasma generator 237, and is not directly sprayed onto the reference electrode 270 and the application electrode 271. Therefore, it is possible to suppress a generation of particles. Similar to the gas supply holes 250a, the gas supply holes 250b are provided from the lower portion to the upper portion of the reaction tube 203. The light emitting tube 249e is configured such that a gas such as a second gas confined therein is capable of being converted into a plasma state in the light emitting tube 249e and thereby serving as a light emitting source described later. The light emitting tube 249e is arranged such that a light is capable of being irradiated toward a center of the process chamber 201 via the gas supply ports 302.

As described above, according to the present embodiments, the gases such as the source gas and the first gas are supplied through the nozzle 249a and the nozzle 249b (and the plasma generator 237), which are provided in the vertical annular space (that is, a cylindrical space) when viewed from above defined by an inner surface of the side wall (that is, the inner wall) of the reaction tube 203 and the edge of each of the wafers 200 arranged in the reaction tube 203. Then, the gases are ejected into the reaction tube 203 in the vicinity of each of the wafers 200 through the gas supply holes 250a of the nozzle 249a and the gas supply holes 250b of the nozzle 249b (and the gas supply ports 302 of the plasma generator 237), respectively. The gas ejected into the reaction tube 203 mainly flows parallel to the surface of each of the wafers 200, that is, in a horizontal direction. Thereby, it is possible to uniformly supply the gas to each of the wafers 200, and it is also possible to improve a thickness uniformity of a film formed on each of the wafers 200. After passing the surface of each of the wafers 200, the gas (for example, a residual gas remaining after a reaction) flows toward an exhaust port, that is, toward an exhaust pipe 231 described later. However, a flow direction of the residual gas may vary depending on a location of the exhaust port, and is not limited to the vertical direction.

The source gas is supplied into the process chamber 201 through the gas supply pipe 232a provided with the MFC 241a and the valve 243a and the nozzle 249a.

The first gas is supplied into the buffer structure 300 through the gas supply pipe 232b provided with the MFC 241b and the valve 243b and the nozzle 249b.

The inert gas is supplied into the process chamber 201 through the gas supply pipe 232c provided with the MFC 241c and the valve 243c and the nozzle 249a.

The inert gas is supplied into the buffer structure 300 through the gas supply pipe 232d provided with the MFC 241d and the valve 243d and the nozzle 249b.

The second gas is supplied into the light emitting tube 249e through the gas supply pipe 232e provided with the MFC 241e and the valve 243e. Further, the inert gas is supplied into the light emitting tube 249e through the gas supply pipe 232f provided with the MFC 241f and the valve 243f.

A source gas supplier (which is a source gas supply structure or a source gas supply system) through which the source gas is supplied is constituted mainly by the gas supply pipe 232a, the MFC 241a, the valve 243a and the nozzle 249a. A first gas supplier (which is a first gas supply structure or a first gas supply system) through which the first gas is supplied is constituted mainly by the gas supply pipe 232b, the MFC 241b, the valve 243b and the nozzle 249b. A second gas supplier (which is a second gas supply structure or a second gas supply system) through which the second gas is supplied is constituted mainly by the gas supply pipe 232e, the MFC 241e and the valve 243e. An inert gas supplier (which is an inert gas supply structure or an inert gas supply system) which the inert gas is supplied is constituted mainly by the gas supply pipes 232c, 232d and 232f, the MFCs 241c, 241d and 241f and the valves 243c, 243d and 243f. The source gas supplier, the first gas supplier, the second gas supplier and the inert gas supplier may also be simply referred to as a "gas supplier" which is a gas supply structure or a gas supply system.

<Substrate Retainer>

As shown in FIG. 1, a boat 217 serving as a substrate retainer is configured to align the wafers 200 (for example, from 25 wafers to 200 wafers) in the vertical direction and configured to support the wafers 200 in a multistage manner, while the wafers 200 are horizontally oriented with their centers aligned with one another. That is, the boat 217 is configured to support (or accommodate) the wafers 200 with a predetermined interval therebetween. For example, the boat 217 is made of a heat resistant material such as quartz and SiC. A plurality of insulating plates 218 are provided under the boat 217 in a multistage manner. For example, the insulating plates 218 are made of a heat resistant material such as quartz and SiC. With such a configuration, the insulating plates 218 are capable of suppressing a transmission of the heat from the heater 207 to a seal cap 219. However, the present embodiments are not limited thereto. For example, instead of the insulating plates 218, a heat insulating cylinder (not shown) such as a cylinder made of a heat resistant material such as quartz and SiC may be provided under the boat 217.

<Plasma Light Emitting Structure>

Subsequently, a plasma light emitting structure will be described with reference to FIGS. 1 and 2.

The plasma is generated by using a capacitively coupled plasma (abbreviated as "CCP") or a corona discharge. As shown in FIG. 2, for example, the plasma is generated by supplying a high frequency power to the reference electrode 270 and the application electrode 271 described later when the second gas is confined in the light emitting tube 249e (which is a vacuum vessel made of a silicon oxide ($SiO_2$) based material such as quartz).

According to an example of the present embodiments, in the plasma generator 237 serving as the buffer chamber, two rod-shaped electrodes (that is, the reference electrode 270 and the application electrode 271) made of a conductor and formed as an elongated thin and long structure are arranged from the lower portion to the upper portion of the reaction tube 203 along the stacking direction of the wafers 200. Each of the reference electrode 270 and the application electrode 271 is provided parallel to the light emitting tube 249e. Each of the reference electrode 270 and the application electrode 271 is covered and protected by an electrode protection tube 275 from an upper portion to a lower portion thereof. The electrode protection tube 275 is provided to protect each of the reference electrode 270 and the application electrode 271, and is constituted by a quartz tube of a U-shape, an H-shape, a Π-shape or the like. End portions of the electrode protection tube 275 are connected to the plasma generator 237 at an upper region in the plasma generator 237.

According to the example of the present embodiments, as shown in FIG. 2, the application electrode 271 is connected to a high frequency power supply 273 through a matcher 272 (which is a matching structure). Thereby, the high frequency power is capable of being applied to the application electrode 271. Further, the reference electrode 270 is grounded by being connected to an electrical ground. Thereby, a reference potential is applied to the reference electrode 270. By applying the high frequency power such as an RF (radio frequency) power and a pulse wave (for example, a nanopulse) power from the high frequency power supply 273 to the application electrode 271 to cause an electrical action between the reference electrode 270 and the application electrode 271, the plasma is generated in a plasma generation region 224 (within the light emitting tube 249e) between the reference electrode 270 and the application electrode 271. Further, when the high frequency power such as the RF power and the pulse wave power is applied from the high frequency power supply 273 to the application electrode 271, the plasma is generated in a region between the reference electrode 270 and the application electrode 271 in a region outside of the plasma generation region 224 of the light emitting tube 249e. The plasma light emitting structure (also referred to as a "plasma light emitting apparatus") serving as the light emitting source is constituted mainly by the reference electrode 270, the application electrode 271 and the light emitting tube 249e. The light emitting source may further include the matcher 272 and the high frequency power supply 273. The light emitting source functions as a photoexcitation structure (or a photoactivation structure) with respect to the gas, as described below.

The electrode protection tube 275 is configured such that each of the reference electrode 270 and the application electrode 271 (which are covered and protected by the electrode protection tube 275) is capable of being inserted into the plasma generator 237 in a state of being isolated from an inner atmosphere of the plasma generator 237. When an oxygen ($O_2$) concentration of an inside of the electrode protection tube 275 is set to the same level as an oxygen concentration of an outside air (for example, an air atmosphere), each of the reference electrode 270 and the application electrode 271 inserted into the electrode protection tube 275 may be oxidized by the heat of the heater 207. Therefore, by charging the inside of the electrode protection tube 275 with the inert gas such as $N_2$ gas or by purging the inside of the electrode protection tube 275 with the inert gas such as the $N_2$ gas using an inert gas purge structure (which is an inert gas purge apparatus), it is possible to lower the oxygen concentration of the inside of the electrode protection tube 275. Thereby, it is possible to suppress the oxidation of the reference electrode 270 and the application electrode 271.

<Exhauster>

As shown in FIG. 1, the exhaust pipe 231 through which an inner atmosphere of the process chamber 201 is exhausted is provided at the reaction tube 203. A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (which is a pressure detection structure) to detect an inner pressure of the process chamber 201, and the APC valve 244 serves as an exhaust valve (which is a pressure regulator). With the vacuum pump 246 in operation, the APC valve 244 may be opened or closed to vacuum-exhaust the process chamber 201 or stop the vacuum exhaust. With the vacuum pump 246 in operation, an opening degree of the APC valve 244 may be adjusted based on pressure information detected by the pressure sensor 245, in order to control (or adjust) the inner pressure of the process chamber 201. An exhauster (which is an exhaust system or an exhaust structure) is constituted mainly by the exhaust pipe 231, the APC valve 244 and the pressure sensor 245. The exhauster may further include the vacuum pump 246. The present embodiments are not limited to an example in which the exhaust pipe 231 is provided at the reaction tube 203. For example, similar to the nozzles 249a and 249b, the exhaust pipe 231 may be provided at the manifold 209 instead of the reaction tube 203.

<Peripheral Device>

The seal cap 219 serving as a furnace opening lid capable of airtightly sealing a lower end opening of the manifold 209 is provided under the manifold 209. The seal cap 219 is in contact with the lower end of the manifold 209 from thereunder. For example, the seal cap 219 is made of a metal such as SUS (stainless steel), and is of a disk shape. An O-ring 220b serving as a seal provided on an upper surface of the seal cap 219 so as to be in contact with the lower end of the manifold 209.

A rotator 267 configured to rotate the boat 217 is provided under the seal cap 219 in a manner opposite to the process chamber 201. A rotating shaft 255 of the rotator 267 is connected to the boat 217 through the seal cap 219. As the rotator 267 rotates the boat 217, the wafers 200 supported by the boat 217 are rotated. That is, the rotator 267 is configured to rotate the wafers 200. A boat elevator 115 serving as an elevating structure is provided outside the reaction tube 203 vertically. The seal cap 219 is capable of being elevated or lowered in the vertical direction by the boat elevator 115. When the seal cap 219 is elevated or lowered by the boat elevator 115, the wafers 200 may be transferred (loaded) into the process chamber 201 or transferred (unloaded) out of the process chamber 201. Thereby, the boat elevator 115 serves as a transfer device (or a transfer structure) for the wafers 200.

A shutter 219s serving as a furnace opening lid capable of airtightly sealing the lower end opening of the manifold 209 is provided under the manifold 209. The shutter 219s is capable of closing the lower end opening of the manifold 209 when the seal cap 219 is lowered by the boat elevator 115. The shutter 219s is made of a metal such as SUS (stainless steel), and of a disk shape. An O-ring 220c serving as a seal is provided on an upper surface of the shutter 219s so as to be in contact with the lower end of the manifold 209. An opening and closing operation of the shutter 219s such as an elevation operation and a rotation operation is controlled by a shutter opener/closer (which is a shutter opening and closing structure) 115s.

A temperature sensor 263 serving as a temperature detector is provided in the reaction tube 203. A state of electric conduction to the heater 207 is adjusted based on temperature information detected by the temperature sensor 263 such that a desired temperature distribution of the inner temperature of the process chamber 201 can be obtained. Similar to the nozzles 249a and 249b, the temperature sensor 263 is provided along the inner wall of the reaction tube 203.

<Controller>

Figure 3:
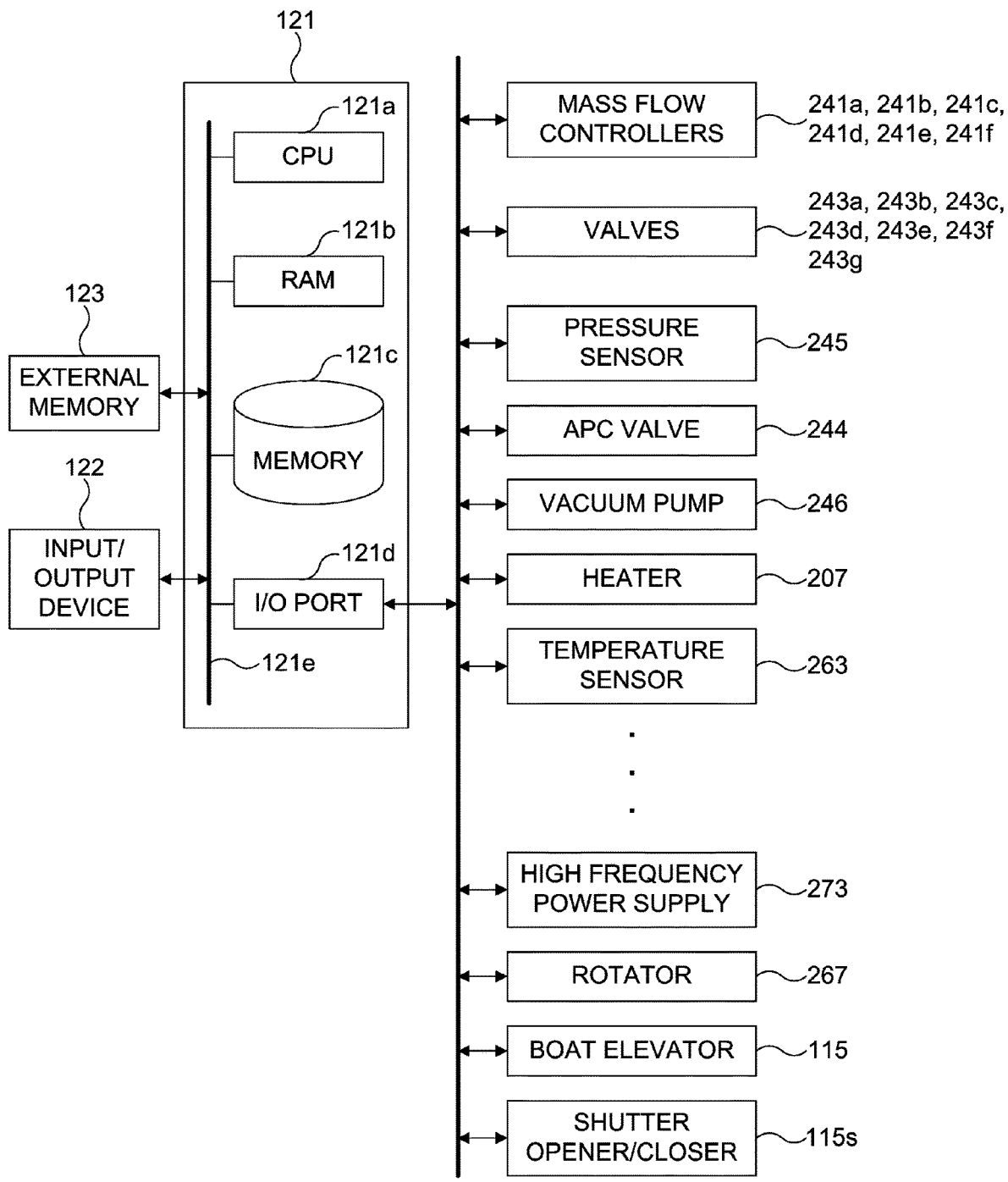
FIG. 3 is a block diagram schematically illustrating an exemplary configuration of a controller and related components of the substrate processing apparatus shown in FIG. 1.

As shown in FIG. 3, a controller 121 serving as a control device (control structure) is constituted by a computer including a CPU (Central Processing Unit) 121a, a RAM (Random Access Memory) 121b, a memory 121c and an I/O (input/output) port 121d. The RAM 121b, the memory 121c and the I/O port 121d may exchange data with the CPU 121a through an internal bus 121e. For example, an input/output device 122 constituted by components such as a touch panel is connected to the controller 121.

The memory 121c is constituted by components such as a flash memory, a hard disk drive (HDD) and a solid state drive (SSD). For example, a control program configured to control an operation of the substrate processing apparatus and a process recipe containing information on sequences and conditions of a substrate processing such as a film-forming process described later may be readably stored in the memory 121c. The process recipe is obtained by combining steps of the substrate processing such as the film-forming process described later such that the controller 121 can execute the steps to acquire a predetermined result, and functions as a program. Hereafter, the process recipe and the control program may be collectively or individually referred to as a "program". In addition, the process recipe may also be simply referred to as a "recipe". In the present specification, the term "program" may refer to the recipe alone, may refer to the control program alone, or may refer to both of the recipe and the control program. The RAM 121b functions as a memory area (work area) where a program or data read by the CPU 121a is temporarily stored.

The I/O port 121d is connected to the components described above such as the MFC 241a, the MFC 241b, the MFC 241e, the MFCs 241c, 241d and 241f, the valve 243a, the valve 243b, the valve 243e, the valves 243c, 243d and 243f, the exhaust valve 243g, the pressure sensor 245, the APC valve 244, the vacuum pump 246, the heater 207, the temperature sensor 263, the rotator 267, the boat elevator 115, the shutter opener/closer 115s and the high frequency power supply 273.

The CPU 121a is configured to read the control program from the memory 121c and execute the control program. In addition, the CPU 121a is configured to read the recipe from the memory 121c in accordance with an operation command inputted from the input/output device 122. In accordance with the contents of the read recipe, the CPU 121a is configured to be capable of controlling various operations such as a control operation of the rotator 267, flow rate adjusting operations for various gases by the MFC 241a, the MFC 241b, the MFC 241e and the MFCs 241c, 241d and 241f, opening and closing operations of the valve 243a, the valve 243b, the valve 243e, the valves 243c, 243d and 243f and the exhaust valve 243g, an opening and closing operation of the APC valve 244, a pressure adjusting operation by the APC valve 244 based on the pressure sensor 245, a starting and stopping operation of the vacuum pump 246, a temperature adjusting operation of the heater 207 based on the temperature sensor 263, an operation of adjusting a forward/backward rotation, a rotation angle and a rotation speed of the boat 217 by the rotator 267, an elevating and lowering operation of the boat 217 by the boat elevator 115, an opening and closing operation of the shutter 219s by the shutter opener/closer 115s and an operation of supplying the high frequency power by the high frequency power supply 273.

The controller 121 may be embodied by installing the above-described program stored in an external memory 123 into the computer. For example, the external memory 123 may include a magnetic disk such as a hard disk, an optical disk such as a CD, a magneto-optical disk such as an MO and a semiconductor memory such as a USB memory and a SSD memory. The memory 121c or the external memory 123 may be embodied by a non-transitory computer readable recording medium. Hereafter, the memory 121c and the external memory 123 are collectively or individually referred to as a "recording medium". In the present specification, the term "recording medium" may refer to the memory 121c alone, may refer to the external memory 123 alone, or may refer to both of the memory 121c and the external memory 123. Instead of the external memory 123, a communication structure such as the Internet and a dedicated line may be used for providing the program to the computer.

(2) Substrate Processing

Figure 4:
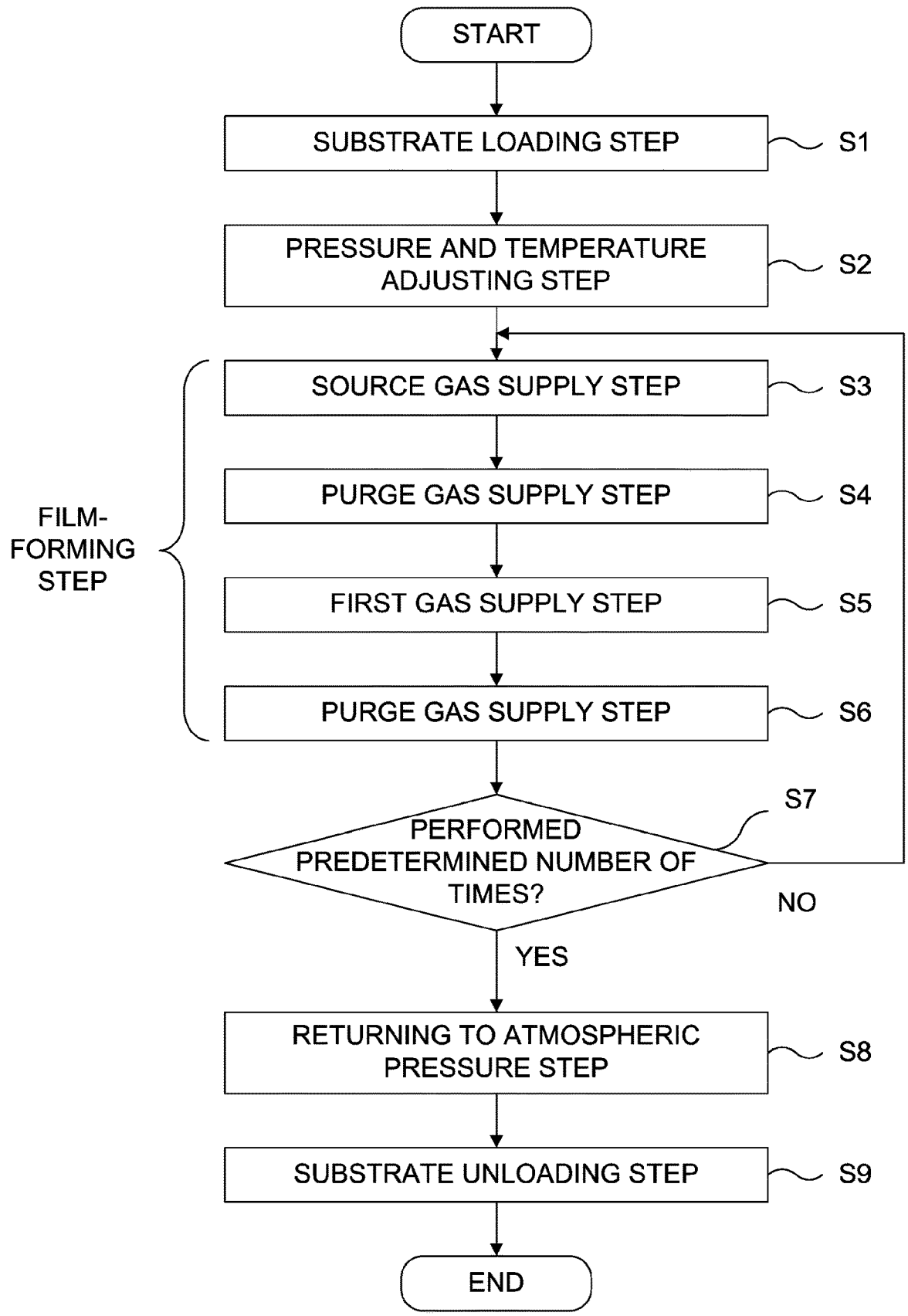
FIG. 4 is a flow chart schematically illustrating an example of a substrate processing performed by using the substrate processing apparatus shown in FIG. 1.

Hereinafter, the substrate processing (that is, the film-forming process) of forming a film on the substrate (that is, the wafer 200) by using the substrate processing apparatus described above, which is a part of a manufacturing process of a semiconductor device, will be described with reference to FIG. 4. In the following descriptions, operations of the components constituting the substrate processing apparatus are controlled by the controller 121.

In the present specification, for convenience, a sequence of the film-forming process shown in FIG. 4 may be illustrated as follows. The same also applies to modified examples and other embodiments described later.

(Source Gas→First Gas)×n

In the present specification, the term "wafer" may refer to "a wafer itself", or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", or may refer to "a surface of a predetermined layer (or a predetermined film) formed on a wafer". Thus, in the present specification, "forming a predetermined layer (or film) on a wafer" may refer to "forming a predetermined layer (or film) directly on a surface of a wafer itself", or may refer to "forming a predetermined layer (or film) on a surface of another layer (or another film) formed on a wafer".

In the present specification, the terms "substrate" and "wafer" may be used as substantially the same meaning.

<Substrate Loading Step: S1>

The wafers 200 are transferred (or charged) into the boat 217 (wafer charging operation). After the boat 217 is charged with the wafers 200, the shutter 219s is moved by the shutter opener/closer 115s to open the lower end opening of the manifold 209 (shutter opening operation). Then, as shown in FIG. 1, the boat 217 charged with the wafers 200 is elevated by the boat elevator 115 and transferred (or loaded) into the process chamber 201 (boat loading operation). With the boat 217 loaded, the seal cap 219 seals the lower end of the manifold 209 via the O-ring 220b.

<Pressure and Temperature Adjusting Step: S2>

The vacuum pump 246 vacuum-exhausts (or decompresses and exhausts) the inner atmosphere of the process chamber 201 until the inner pressure of the process chamber 201 in which the wafers 200 are accommodated reaches and is maintained at a desired pressure (vacuum degree). In the pressure and temperature adjusting step S2, the inner pressure of the process chamber 201 is measured by the pressure sensor 245, and the APC valve 244 is feedback-controlled based on the measured pressure information. The vacuum pump 246 continuously vacuum-exhausts the inner atmosphere of the process chamber 201 until at least a film-forming step described later is completed.

Further, the heater 207 heats the process chamber 201 until a temperature of the wafer 200 in the process chamber 201 reaches and is maintained at a desired temperature. In the pressure and temperature adjusting step S2, the state of the electric conduction to the heater 207 is feedback-controlled based on the temperature information detected by the temperature sensor 263 such that a desired temperature distribution of the inner temperature of the process chamber 201 can be obtained. The heater 207 continuously heats the process chamber 201 until at least the film-forming step described later is completed. However, when the film-forming step is performed at a temperature equal to or lower than a room temperature, the heating of the process chamber 201 by the heater 207 may be omitted. Further, when the film-forming step is performed only at the temperature equal to or lower than the room temperature, the heater 207 may be omitted and the substrate processing apparatus may be implemented without the heater 207. In such a case, it is possible to simplify the configuration of the substrate processing apparatus.

Then, the rotator 267 starts rotating the boat 217 and the wafers 200 accommodated in the boat 217. The rotator 267 continuously rotates the boat 217 and the wafers 200 until at least the film-forming step described later is completed.

<Film-Forming Step: S3, S4, S5 and S6>

Thereafter, the film-forming step is performed by performing a cycle including a source gas supply step S3, a purge gas supply step S4, a first gas supply step S5 and a purge gas supply step S6 in this sequential order.

<Source Gas Supply Step and Purge Gas Supply Step: S3 and S4>

In the source gas supply step S3, the source gas is supplied onto the wafer 200 in the process chamber 201.

The valve 243a is opened to supply the source gas into the gas supply pipe 232a. After a flow rate of the source gas is adjusted by the MFC 241a, the source gas whose flow rate is adjusted is supplied into the process chamber 201 through the nozzle 249a and the gas supply holes 250a, and is exhausted through the exhaust pipe 231. Thereby, the source gas is supplied onto the wafer 200. Simultaneously, the valve 243c is opened to supply the inert gas into the gas supply pipe 232c. After a flow rate of the inert gas is adjusted by the MFC 241c, the inert gas whose flow rate is adjusted is supplied with the source gas into the process chamber 201, and is exhausted through the exhaust pipe 231.

In order to prevent the source gas from entering the nozzle 249b, the valve 243d may be opened to supply the inert gas into the gas supply pipe 232d. The inert gas is supplied into the process chamber 201 through the gas supply pipe 232d and the nozzle 249b, and is exhausted through the exhaust pipe 231.

For example, a supply flow rate of the source gas adjusted by the MFC 241a may be within a range from 1 sccm to 2,000 sccm, preferably from 10 sccm to 1,000 sccm. In the present specification, a notation of a numerical range such as "from 1 sccm to 2,000 sccm" means that a lower limit and an upper limit are included in the numerical range. Therefore, for example, a numerical range "from 1 sccm to 2,000 sccm" means a range equal to or higher than 1 sccm and equal to or lower than 2,000 sccm. The same also applies to other numerical ranges described herein. For example, a supply flow rate of the inert gas adjusted by each of the MFCs 241c and 241d may be within a range from 100 sccm to 10,000 sccm. For example, the inner pressure of the process chamber 201 may be within a range from 1 Pa to 2,666 Pa, preferably from 67 Pa to 1,333 Pa. For example, a time duration of supplying the source gas onto the wafer 200 may be within a range from 1 second to 100 seconds, preferably from 1 second to 50 seconds.

For example, a temperature of the heater 207 is set (or adjusted) such that the temperature of the wafer 200 may be within a range from 0° C. to 150° C., preferably from the room temperature (25° C.) to 100° C., and more preferably from 40° C. to 90° C. The source gas is easily adsorbed on a component such as the wafer 200, and a reactivity of the source gas is high. Therefore, even when the temperature of the wafer 200 in the source gas supply step S3 is low (for example, at the room temperature), the source gas is chemically adsorbed on the wafer 200. Thereby, it is possible to obtain a practical film-forming rate. By setting the temperature of the wafer 200 to be equal to or lower than 150° C., or equal to or lower than 100° C. or equal to or lower than 90° C. according to the present embodiments, it is possible to reduce the heat applied to the wafer 200. Thereby, it is possible to properly control a thermal history (or a thermal budget) of the wafer 200. In addition, when the temperature of the wafer 200 is equal to or higher than 0° C., the source gas is sufficiently adsorbed on the wafer 200. Thereby, it is possible to obtain the practical film-forming rate. Therefore, in the source gas supply step S3, the temperature of the wafer 200 is set within the range from 0° C. to 150° C., preferably from the room temperature to 100° C., and more preferably from 40° C. to 90° C.

By supplying the source gas onto the wafer 200 under the conditions described above, for example, a silicon-containing layer with a thickness of less than a single atomic layer (or a single molecular layer) to several atomic layers (or several molecular layers) is formed on the wafer 200 (that is, on an underlying film or a base film of a surface of the wafer 200). The silicon-containing layer may include a silicon layer alone, may include an adsorption layer of a source material of the source gas, or may include both of the silicon layer and the adsorption layer of the source material.

In the present specification, "a layer with a thickness of less than a single atomic layer (or a single molecular layer)" may refer to an atomic layer (or a molecular layer) which is discontinuously formed, and "a layer with a thickness of a single atomic layer (or a single molecular layer)" may refer to an atomic layer (or a molecular layer) which is continuously formed. The silicon-containing layer may include both of the silicon layer and the adsorption layer of the source material. As described above, expressions such as "a single atomic layer" and "several atomic layers" may be used for the silicon-containing layer. In the present specification, the terms "atomic layer" and "molecular layer" may be used as substantially the same meaning for the silicon-containing layer.

After the silicon-containing layer is formed, the valve 243a is closed to stop a supply of the source gas into the process chamber 201. When stopping the supply of the source gas, with the APC valve 244 open, the vacuum pump 246 vacuum-exhausts the inner atmosphere of the process chamber 201 to remove the source gas (which did not react or which did contribute to a formation of the silicon-containing layer) remaining in the process chamber 201 or reaction byproducts from the process chamber 201 (purge gas supply step S4). Further, by maintaining the valves 243c and 243d open, the inert gas is continuously supplied into the process chamber 201. The inert gas serves as a purge gas. The purge gas supply step S4 is optional and may be omitted. That is, the source gas supply step S3 may be performed without performing the purge gas supply step S4.

Various gases may be used as the source gas. For example, an aminosilane source gas such as bis (tertiarybutylamino) silane ($SiH_2[NH(C_4H_9)]_2$, abbreviated as BTBAS) gas, tetrakis (dimethylamino) silane ($Si[N(CH_3)_2]_4$, abbreviated as 4DMAS) gas, tris (dimethylamino) silane ($Si[N(CH_3)_2]_3H$, abbreviated as 3DMAS) gas, bis (dimethylamino) silane ($Si[N(CH_3)_2]_2H_2$, abbreviated as BDMAS) gas, bis (diethylamino) silane ($Si[N(C_2H_5)_2]_2H_2$, abbreviated as BDEAS) gas, dimethylaminosilane (DMAS) gas, diethylaminosilane (DEAS) gas, dipropylaminosilane (DPAS) gas, diisopropylaminosilane (DIPAS) gas, butylaminosilane (BAS) gas and hexamethyldisilazane (HMDS) gas may be used as the source gas. Further, an inorganic halosilane source gas (chlorosilane source gas) such as monochlorosilane ($SiH_3Cl$, abbreviated as MCS) gas, dichlorosilane ($SiH_2Cl_2$, abbreviated to DCS) gas, trichlorosilane ($SiHCl_3$, abbreviated as TCS) gas, tetrachlorosilane ($SiCl_4$, abbreviated as STC) gas, hexachlorodisilane ($Si_2Cl_6$, abbreviated as HCDS) gas and octachlorotrisilane ($Si_3Cl_8$, abbreviated as OCTS) gas may be used as the source gas. Still further, an inorganic silane source gas free of halogen group (that is, silicon hydride gas) such as monosilane ($SiH_4$, abbreviated as MS) gas, disilane ($Si_2H_6$, abbreviated as DS) gas and trisilane ($Si_3H_8$, abbreviated as TS) gas may also be used as the source gas.

The $N_2$ gas may be used as the inert gas. Instead of the $N_2$ gas, for example, a rare gas such as argon (Ar) gas, helium (He) gas, neon (Ne) gas and xenon (Xe) gas may be used as the inert gas. In the steps described later, the inert gas such as the $N_2$ gas and the rare gas may be supplied as in the purge gas supply step S4.

<First Gas Supply Step and Purge Gas Supply Step: S5 and S6>

After the source gas supply step S3 (and the purge gas supply step S4) is completed, a photo-excited gas serving as the first gas is supplied onto the wafer 200 in the process chamber 201 (first gas supply step S5).

In the first gas supply step S5, the opening and closing operations of the valve 243b and the valves 243c and 243d may be performed (or controlled) in the same manners as those of the valve 243a and the valves 243c and 243d in the source gas supply step S3. After a flow rate of the first gas is adjusted by the MFC 241b, the first gas whose flow rate is adjusted is supplied into the plasma generator 237 through the nozzle 249b. In the first gas supply step S5, after a flow rate of the second gas is adjusted by the MFC 241e, the second gas whose flow rate is adjusted is supplied into the light emitting tube 249e through the valve 243e. When an inner pressure of the light emitting tube 249e reaches and is maintained at a desired pressure, a supply of the second gas into the light emitting tube 249e is stopped, and the valve 243e is closed. Thereby, the second gas is confined in the light emitting tube 249e maintained at the desired pressure. In such a state, when the high frequency power (with a frequency of 13.56 MHz according to the present embodiments) is supplied (or applied) from the high-frequency power supply 273 to the reference electrode 270 and the application electrode 271, the plasma is generated in the light emitting tube 249e, and the second gas is caused to emit the light. The first gas supplied to the process chamber 201 through the plasma generator 237 and the gas supply ports 302 is photo-excited in the plasma generator 237 and in the process chamber 201 by the light emitted from the light emitting tube 249e, and is supplied to the wafer 200 as an active species. Then, the first gas is exhausted through the exhaust pipe 231. Further, the active species in the plasma generator 237 in the first gas supply step S5 may also include an active species directly generated (that is, generated without a photoexcitation) by the application electrode 271 and the reference electrode 270 to which the high frequency power is supplied.

For example, a supply flow rate of the first gas adjusted by the MFC 241b may be within a range from 10 sccm to 10,000 sccm, and a supply flow rate of the second gas adjusted by the MFC 241e may be within a range from 10 sccm to 1,000 sccm. For example, the high frequency power applied from the high frequency power supply 273 to each of the reference electrode 270 and the application electrode 271 may be within a range from 50 W to 1,000 W. For example, the inner pressure of the light emitting tube 249e may be within a range from 10 kPa to 100 kPa, and the inner pressure of the process chamber 201 may be within a range from 1 Pa to 100 Pa. By using the light emitting tube 249e as the light emitting source, it is possible to activate the first gas even when the inner pressure of the process chamber 201 is relatively low as described above. For example, a time duration of supplying the active species obtained by photo-exciting the first gas onto the wafer 200 may be within a range from 1 second to 100 seconds, preferably from 1 second to 50 seconds. Other process conditions of the first gas supply step S5 are the same as those of the source gas supply step S3.

By using the active species (which is electrically neutral), an oxidation process described later is performed with respect to the silicon-containing layer formed on the surface of the wafer 200.

By supplying the first gas onto the wafer 200 according to the above-described process conditions, the silicon-containing layer formed on the wafer 200 is oxidized. When the silicon-containing layer is oxidized, silicon (Si)—nitrogen (N) bonds and silicon (Si)—hydrogen (H) bonds contained in the silicon-containing layer are broken by the internal energy of the photo-excited first gas. Nitrogen (N) and hydrogen (H) separated from silicon (Si) and carbon (C) bonded to nitrogen are desorbed from the silicon-containing layer. Dangling bonds of silicon in the silicon-containing layer produced due to a separation of nitrogen, hydrogen or carbon enables a bonding of silicon in the silicon-containing layer to oxygen (O) in the first gas to form silicon (Si)—oxygen (O) bonds. As a reaction of forming the Si—O bonds progresses, the silicon-containing layer is changed (modified) into a layer containing silicon and oxygen, that is, a silicon oxide layer (also referred to as a "SiO layer").

Further, in order to modify the silicon-containing layer into the SiO layer, it is preferable that the first gas is photo-excited and then supplied. When the first gas in an unexcited state is supplied, an internal energy demanded to oxidize the silicon-containing layer may be insufficient at the above-described temperature range. Therefore, it may be difficult to fully separate nitrogen or carbon from the silicon-containing layer or to fully oxidize the silicon-containing layer to increase the number of the Si—O bonds.

After the silicon-containing layer is modified to the SiO layer, the valve 243b is closed to stop the supply of the first gas into the process chamber 201. A supply of the high frequency power to the reference electrode 270 and the application electrode 271 is also stopped. In the purge gas supply step S6, the first gas or the reaction byproducts remaining in the process chamber 201 are removed from the process chamber 201 according to the same sequence and conditions as those of the purge gas supply step S4. Further, in the purge gas supply step S6, the second gas confined in the light emitting tube 249e is exhausted through the gas exhaust pipe 232g via the exhaust valve 243g. A part of the purge gas supply step S6 may be omitted, and a subsequent step (that is, a step S7) may be performed.

Various gases may be used as the first gas to be photo-excited. For example, a gas such as oxygen ($O_2$) gas, nitrogen peroxide ($N_2O$) gas, nitrogen monoxide (NO) gas, nitrogen dioxide ($NO_2$) gas, ozone ($O_3$) gas, hydrogen peroxide ($H_2O_2$) gas, water vapor ($H_2O$ gas), ammonium hydroxide ($NH_4(OH)$) gas, carbon monoxide (CO) gas and carbon dioxide ($CO_2$) gas may be used as the first gas.

Various gases may be used as the second gas that causes the plasma light emission. For example, a rare gas such as xenon (Xe) gas, helium (He) gas, neon (Ne) gas, argon (Ar) gas and krypton (Kr) gas and a gas such as nitrogen ($N_2$) gas, light hydrogen ($H_2$) gas and deuterium ($D_2$) gas may be used as the second gas. In addition, two or more gases described above may be mixed with one another and used as the second gas.

Various gases may be used as the inert gas. For example, in the purge gas supply step S6, the rare gas exemplified in the purge gas supply step S4 may be used as the inert gas.

<Performing Predetermined Number of Times: S7>

By performing the cycle wherein the steps S3, S4, S5 and S6 are performed non-simultaneously (that is, without synchronization) in this order a predetermined number of times (n times) (that is, one or more times), it is possible to form a silicon oxide film (also referred to as a "SiO film") of a predetermined composition and a predetermined thickness on the wafer 200. It is preferable that the cycle is performed a plurality of times. That is, it is preferable that the SiN film of a desired thickness is formed by laminating the SiN layer thinner than the desired thickness by performing the cycle a plurality of times until the desired thickness is obtained.

<Returning to Atmospheric Pressure Step: S8>

After the film-forming step described above is completed, the inert gas is supplied into the process chamber 201 through each of the gas supply pipes 232c and 232d, and then is exhausted through the exhaust pipe 231. The process chamber 201 is thereby purged with the inert gas such that the gas such as the first gas and the reaction byproducts remaining in the process chamber 201 are removed from the process chamber 201 (purging by the inert gas). Thereafter, the inner atmosphere of the process chamber 201 is replaced with the inert gas (substitution by the inert gas), and the inner pressure of the process chamber 201 is returned to the atmospheric pressure (returning to the atmospheric pressure, S8).

<Substrate Unloading Step: S9>

Then, the seal cap 219 is lowered by the boat elevator 115 and the lower end of the manifold 209 is opened. The boat 217 with the processed wafers 200 charged therein is unloaded out of the reaction tube 203 through the lower end of the manifold 209 (boat unloading operation). After the boat 217 is unloaded, the shutter 219s is moved. Thereby, the lower end opening of the manifold 209 is sealed by the shutter 219s through the O-ring 220c (shutter closing operation). The processed wafers 200 are taken out of the reaction tube 203, and then discharged from the boat 217 (wafer discharging operation). Further, an empty boat 217 may be loaded into the process chamber 201 after the wafer discharging operation.

According to the present embodiments, it is preferable that an inner pressure of a furnace (that is, the process furnace 202) during the substrate processing using the first gas is controlled to a pressure within a range from 1 Pa to 100 Pa. When the inner pressure of the furnace is lower than 1 Pa, a supply amount of the active species generated by the photoexcitation is low, and it takes time to perform the oxidation process. Further, when the inner pressure of the furnace is higher than 100 Pa, since a generation amount of the active species is saturated, the first gas is wasted. Further, when the inner pressure of the furnace is higher than 100 Pa, a transport efficiency of the active species to the wafer 200 may deteriorate since a mean free path of gas molecules becomes shorter.

(3) Effects According to Present Embodiments

According to the present embodiments, one or more of the following effects can be obtained.

(a) By changing plasma generation conditions (such as a gas species, a pressure of the gas, the high frequency power and the frequency) in the light emitting tube 249e, it is possible to control a light intensity and a wavelength of the plasma light emission, and it is also possible to control a light exciting state of the gas irradiated with the light and an amount of the photo-excited active species.

(b) It is possible to generate the photo-excited active species directly on a central portion of the wafer 200 by irradiating the center of the process chamber 201 with the light from the light emitting source, and it is also possible to improve an efficiency of supplying the active species to the wafer 200.

(c) By controlling the light intensity and the wavelength of the plasma light emission, it is possible to control (or adjust) a generation distribution of the photo-excited active species in a space above the wafer 200, and it is also possible to sufficiently obtain a uniformity of a wafer processing (that is, the substrate processing) on the surface of the wafer 200.

Other Embodiments of Present Disclosure

While the technique of the present disclosure is described in detail by way of the embodiments described above, the technique of the present disclosure is not limited thereto. The technique of the present disclosure may be modified in various ways without departing from the scope thereof.

For example, the embodiments described above are described by way of an example in which the light emitting tube 249e constituting the light emitting source is made of a silicon oxide ($SiO_2$) based material such as quartz. However, the technique of the present disclosure is not limited thereto. For example, when the wavelength used to photo-excite the first gas is on a short wavelength side of a ultraviolet light region, the light emitting source may be constituted by the light emitting tube 249e made of a material in which magnesium fluoride ($MgF_2$) and calcium fluoride ($CaF_2$) are partially used such that the light is capable of passing through the light emitting tube 249e. In addition, for example, a wavelength band of the light used to photo-excite the first gas is within a range from 110 nm to 5 μm, and the light emitting tube 249e may be replaced with another light emitting tube made of a different material depending on the wavelength band of the light. That is, for example, by irradiating the center of the process chamber 201 with a vacuum ultraviolet light, it is possible to supply the active species with higher internal energy to the wafer 200. Thereby, it is possible to further increase the film-forming rate. If the wavelength of the light is less than 110 nm or more than 5 μm, even when the light is emitted, the light emitting tube 249e cannot be used as the light emitting source because the light cannot pass through the light emitting tube 249e. That is, by setting the wavelength band of the light within a range from 110 nm to 5 μm, it becomes possible to use the light emitting tube 249e as the light emitting source. In the present specification, as described above, a notation of a numerical range such as "from 110 nm to 5 μm" means that a lower limit and an upper limit are included in the numerical range. Therefore, for example, a numerical range "from 110 nm to 5 μm" means a range equal to or higher than 110 nm and equal to or lower than 5 μm. The same also applies to other numerical ranges described herein.

For example, the embodiments described above are described by way of an example in which the first gas is photo-excited by a configuration of a set of the buffer structure 300 and the light emitting source, and the active species thereof is supplied to the wafer 200. However, the technique of the present disclosure is not limited thereto. For example, the first gas may be photo-excited by a configuration of a plurality of sets to supply the active species to the wafer 200. In other words, it is possible to increase the supply amount of the active species generated by the photoexcitation. Thereby, it is possible to increase the film-forming rate.

For example, the embodiments described above are described by way of an example in which the first gas is supplied after the source gas is supplied. However, the technique of the present disclosure is not limited thereto. For example, a supply order of the source gas and the first gas may be changed. That is, the source gas may be supplied after the first gas is supplied. By changing the supply order of the gases, it is possible to change a quality or a composition of the film formed by performing the substrate processing.

For example, the embodiments described above are described by way of an example in which the purge gas used in the purge gas supply step S4 is supplied in an inert state. However, the technique of the present disclosure is not limited thereto. For example, similar to the first gas in the first gas supply step S5, the purge gas may be activated by the photoexcitation by the light emitting source. That is, by using the purge gas such as the $N_2$ gas and the rare gas activated by the photoexcitation to purge the process chamber 201, it is possible to improve an efficiency of removing the source gas (which is unreacted) and the reaction byproducts. Thereby, it is possible to improve the quality of the film.

For example, the embodiments described above are described by way of an example in which the silicon oxide film (SiO film) is formed on the wafer 200. However, the technique of the present disclosure is not limited thereto. For example, the technique of the present disclosure may also be preferably applied to form, on the wafer 200, a silicon-based oxide film such as a silicon oxycarbide film (SiOC film), a silicon oxycarbonitride film (SiOCN film) and a silicon oxynitride film (SiON film).

For example, the technique of the present disclosure may also be applied to form, on the wafer 200, various films such as a silicon nitride film (SiN film), a silicon oxynitride film (SiON film), a silicon oxycarbonitride film (SiOCN film), a silicon oxycarbide film (SiOC film), a silicon carbonitride film (SiCN film), a silicon boronitride film (SiBN film), a silicon boron carbonitride film (SiBCN film) and a boron carbonitride film (BCN film). In such a case, instead of or in addition to the gases described above, for example, a nitrogen (N)-containing gas such as ammonia ($NH_3$) gas, a carbon (C)-containing gas such as propylene ($C_3H_6$) gas and a boron (B)-containing gas such as boron trichloride ($BCl_3$) may be used. In addition, a sequence order of supplying the gases may be changed appropriately. When the technique of the present disclosure is applied to film-forming processes of the various films described above, process conditions of the film-forming processes for the various films described above may be substantially the same as those of the film-forming process according to the embodiments described above and substantially the same advantageous effects as the embodiments described above may be obtained. In such a case, the first gas described above may be used as an oxidizing agent.

Further, the technique of the present disclosure may also be preferably applied to form, on the wafer 200, a metal-based film (such as a metal-based oxide film and a metal-based nitride film) containing a metal element such as titanium (Ti), zirconium (Zr), hafnium (Hf), tantalum (Ta), niobium (Nb), aluminum (Al), molybdenum (Mo) and tungsten (W). That is, the technique of the present disclosure may also be preferably applied to form, on the wafer 200, a film such as a TiO film, a TiOC film, a TiOCN film, a TiON film, a TiN film, a TiSiN film, a TiBN film, a TiBCN film, a ZrO film, a ZrOC film, a ZrOCN film, a ZrON film, a ZrN film, a ZrSiN film, a ZrBN film, a ZrBCN film, a HfO film, a HfOC film, a HfOCN film, a HfON film, a HfN film, a HfSiN film, a HfBN film, a HfBCN film, a TaO film, a TaOC film, a TaOCN film, a TaON film, a TaN film, a TaSiN film, a TaBN film, a TaBCN film, a NbO film, a NbOC film, a NbOCN film, a NbON film, a NbN film, a NbSiN film, a NbBN film, a NbBCN film, an AlO film, an AlOC film, an AlOCN film, an AlON film, an AlN film, an AlSiN film, an AlBN film, an AlBCN film, a MoO film, a MoOC film, a MoOCN film, a MoON film, a MoN film, a MoSiN film, a MoBN film, a MoBCN film, a WO film, a WOC film, a WOCN film, a WON film, a WN film, a WSiN film, a WBN film and a WBCN film.

For example, various gases such as tetrakis (dimethylamino) titanium ($Ti[N(CH_3)_2]_4$, abbreviated as TDMAT) gas, tetrakis (ethylmethylamino) hafnium ($Hf[N(C_2H_5)(CH_3)]_4$, abbreviated as TEMAH) gas, tetrakis (ethylmethylamino) zirconium ($Zr[N(C_2H_5)(CH_3)]_4$, abbreviated as TEMAZ) gas, trimethylaluminum ($Al(CH_3)_3$, abbreviated as TMA) gas, titanium tetrachloride ($TiCl_4$) gas and hafnium tetrachloride ($HfCl_4$) gas may be used as the source gas to form the metal-based oxide film or the metal-based nitride film described above.

That is, the technique of the present disclosure may also be preferably applied to form a metalloid film containing a metalloid element or the metal-based film containing a metal element. The process sequences and the process conditions of the film-forming process of forming the metalloid film or the metal-based film may be substantially the same as those of the film-forming process according to the embodiments described above or the modified examples. Even in such a case, it is possible to obtain substantially the same effects as the embodiments described above.

Recipes used in the film-forming process are preferably prepared individually in accordance with the process contents and stored in the memory 121c via an electric communication line or the external memory 123. When starting various processes, it is preferable that the CPU 121a selects an appropriate recipe among the recipes stored in the memory 121c in accordance with the process contents. Thus, various films of different composition ratios, qualities and thicknesses can be formed in a reproducible manner with universal applicability by using a single substrate processing apparatus. In addition, since a burden on an operating personnel of the substrate processing apparatus can be reduced, various processes can be performed quickly while avoiding a malfunction of the substrate processing apparatus.

The recipe described above is not limited to creating a new recipe. For example, the recipe may be prepared by changing an existing recipe stored in the substrate processing apparatus in advance. When changing the existing recipe to a new recipe, the new recipe may be installed in the substrate processing apparatus via the electric communication line or the recording medium in which the new recipe is stored. Further, the existing recipe already stored in the substrate processing apparatus may be directly changed to the new recipe by operating the input/output device 122 of the substrate processing apparatus.

The technique of the present disclosure can be applied to the substrate processing apparatus, the plasma light emitting apparatus, a method of manufacturing a semiconductor device and a non-transitory computer-readable recording medium storing a program.

According to some embodiments of the present disclosure, it is possible to provide the technique capable of providing a high substrate processing performance even when a low temperature substrate with a large surface area is used.

What is claimed is:

1. A substrate processing apparatus comprising:
a process chamber in which a substrate is processed; and
a plasma generator comprising:
    a first gas supply pipe through which a first gas is supplied,
    an application electrode to which a high frequency power is applied,
    a reference electrode to which a reference potential is applied by being grounded, and
    a light emitting tube by which the first gas is photo-exited;
a second gas supply pipe through which a second gas is supplied is connected to the light emitting tube; and
an opening/closing valve configured to confine the second gas within the light emitting tube is connected to the light emitting tube, and
wherein the light emitting tube is capable of emitting a light by converting the second gas confined in the light emitting tube into a plasma state in accordance with an electrical action between the application electrode and the reference electrode.

2. The substrate processing apparatus of claim 1, further comprising
a substrate retainer configured to support a plurality of substrates including the substrate in a multistage manner in a vertical direction,
wherein the application electrode, the reference electrode and the light emitting tube are arranged in the vertical direction.

3. The substrate processing apparatus of claim 1, wherein a material of the light emitting tube comprises at least one selected from the group consisting of silicon oxide, magnesium fluoride and calcium fluoride.

4. The substrate processing apparatus of claim 1, wherein the first gas comprises a gas photo-excited by the light emitting tube to generate an active species.

5. The substrate processing apparatus of claim 4, wherein the first gas comprises a gas containing at least one selected from the group consisting of oxygen, nitrogen, carbon, hydrogen and a rare gas.

6. The substrate processing apparatus of claim 1, further comprising
an exhaust pipe connected to the light emitting tube and through which the second gas is exhausted.

7. The substrate processing apparatus of claim 1, wherein the second gas is converted into the plasma state in accordance with the electrical action between the application electrode and the reference electrode when the second gas is confined in the light emitting tube.

8. The substrate processing apparatus of claim 1, wherein the second gas comprises a gas containing at least one selected from the group consisting of nitrogen gas, light hydrogen gas, deuterium gas and a rare gas.

9. The substrate processing apparatus of claim 1, wherein the first gas is activated by a photoexcitation in accordance with the light emitted from the light emitting tube to process a plurality of substrates.

10. The substrate processing apparatus of claim 9, wherein the light emitting tube is capable of emitting the light of a wavelength within a range from 110 nm to 5 μm.

11. The substrate processing apparatus of claim 1, wherein the high frequency power comprises a pulse wave power.

12. The substrate processing apparatus of claim 1, wherein the light emitting tube is provided between the application electrode and the reference electrode.

13. The substrate processing apparatus of claim 1, wherein the first gas is photo-excited in the process chamber by the light emitted by converting the second gas confined in the light emitting tube into the plasma state, as a photo-excited first gas and
wherein the photo-excited first gas by the light is supplied to the substrate as an active species.

14. A method of manufacturing a semiconductor device, comprising:
(a) loading a substrate into a process chamber of a substrate processing apparatus, wherein the substrate processing apparatus comprises:
    the process chamber in which the substrate is processed;
    a plasma generator comprising:
        a first gas supply pipe through which a first gas is supplied,
        an application electrode to which a high frequency power is applied,
        a reference electrode to which a reference potential is applied by being grounded, and
        a light emitting tube by which the first gas is photo-exited;
    a second gas supply pipe through which a second gas is supplied is connected to the light emitting tube; and
    an opening/closing valve configured to confine the second gas within the light emitting tube is connected to the light emitting tube, and
    wherein the light emitting tube is capable of emitting a light by converting the second gas confined in the light emitting tube into a plasma state in accordance with an electrical action between the application electrode and the reference electrode;
(b) supplying the first gas into the process chamber; and
(c) activating the first gas by photo-exciting the first gas.

* * * * *